United States Patent [19]

Numata et al.

[11] Patent Number: 5,170,389
[45] Date of Patent: Dec. 8, 1992

[54] SEMICONDUCTOR LASER DRIVING CIRCUIT WITH CONTROL CIRCUIT POWER VOLTAGE MONITOR FOR PREVENTING INADVERTENT RECORDING

[75] Inventors: Tomiyuki Numata; Kunio Kojima; Toshihisa Deguchi; Shigeo Terashima, all of Nara, Japan

[73] Assignee: Sharp Kabushiki Kaisha, Osaka, Japan

[21] Appl. No.: 538,340

[22] Filed: Jun. 15, 1990

[30] Foreign Application Priority Data

Jun. 28, 1989 [JP] Japan .................. 1-165577

[51] Int. Cl.⁵ .............................................. G11B 7/00
[52] U.S. Cl. .................................................. 369/116
[58] Field of Search ................ 369/116, 44.32, 44.33

[56] References Cited

U.S. PATENT DOCUMENTS

| 4,685,097 | 8/1987 | van der Put | 369/116 |
| 4,692,606 | 9/1987 | Sakai et al. | 369/116 |
| 4,785,443 | 11/1988 | Minami et al. | 369/116 |

FOREIGN PATENT DOCUMENTS

| 0082357 | 6/1983 | European Pat. Off. |
| 0219124 | 4/1987 | European Pat. Off. |
| 0256827 | 2/1988 | European Pat. Off. |

OTHER PUBLICATIONS

Patent Abstracts of Japan vol. 7, No. 228 (P-228)(1373) Oct. 8, 1983 and JP-A-58 118 042 (Hitachi Seisakushi K.K.) Jul. 13, 1983.
Patent Abstracts of Japan vol. 8, No. 38 (P-255)(1475) Feb. 18, 1984 and JP-A-58 189 849 (Tokyo Shibaura Denki K.K.) Nov. 5, 1983.

Primary Examiner—Robert Weinhardt
Assistant Examiner—Paul W. Huber
Attorney, Agent, or Firm—Nixon & Vanderhye

[57] ABSTRACT

The invention provides an improvement of the conventional laser driving circuit mainly including a control logic circuit, a reproducing power producing circuit, and a recording power producing circuit for preventing a recording film of a disk from being damaged by a laser in a reproducing mode. The improved respect is addition of a voltage monitoring circuit and a bypass transistor for an abnormal signal. The voltage monitoring circuit monitors a voltage drop caused in the control logic circuit and supplies a voltage abnormality indicating signal, thereby causing the bypass transistor to be conductive for allowing the abnormal signal to be flown therethrough.

8 Claims, 5 Drawing Sheets

SEMICONDUCTOR LASER DRIVING CIRCUIT WITH CONTROL CIRCUIT POWER VOLTAGE MONITOR FOR PREVENTING INADVERTENT RECORDING

BACKGROUND OF THE INVENTION

1. Field of the Invention

The present invention relates to a semiconductor laser driving circuit which is used in an optical disk recording and reproducing system wherein information is recorded on and reproduced from an optical disk.

2. Description of the Related Art

In the conventional optical disk system for recording or reproducing information with a laser beam, in a recording mode, it serves to follow the steps of intensifying or mitigating a laser output pulsewise in accordance with information to be recorded, changing the power of a laser beam spot restricted on a disk by an optical system accordingly, and changing an optical or magnetic state of a beam-irradiated spot of a recording film formed on the disk for recording the information. In a reproducing mode, it serves to follow the steps of irradiating the disk with a laser beam having such an intensity as not transforming the recording film and detecting the reflected beam for reproducing the information recorded thereon.

It will be understood from this function that it is necessary to keep a laser output at a predetermined value in both the recording and the reproducing modes. Because the semiconductor laser is subject to the change of an ambient temperature of the used semiconductors, the laser output is required to be controlled so that it can avoid any influence affected by the temperature change or the other factors.

FIG. 1 is a circuit diagram showing a conventional laser driving circuit, which mainly includes a control logic circuit 11, a reproduction power producing circuit 12, and a recording power producing circuit 13. Further, it is seen from this figure that a laser 3 and a photodetector 4 are also added to the circuit. The photodetector 4 may employ a photodiode. As shown, the control logic circuit 11 is connected to a +5 V power source and the reproduction power producing circuit 12 and the recording power producing circuit 13 are connected to a +12 V power source.

The reproduction power producing circuit 12 includes a transistor 2 for driving the laser 3 in a reproducing mode, a current-to-voltage converting circuit 5 for converting the current generated in the photodetector 4 into a voltage, an operational amplifier 6 for amplifying the converted voltage, and a switching circuit 1 for switching on and off a contact between the operational amplifier 6 and the transistor 2.

The recording power producing circuit 13 consists of a transistor 9 for driving the laser 3 in a recording mode, a recording power setting circuit 8 connected to the base of transistor 9, and a switching 10 for switching on and off a contact between the transistor 9 and the laser 3.

In operation, in the reproducing mode, the control logic circuit 11 supplies the reproduction signal a to the switching circuit 1, thereby switching on the switching circuit 1 and activating the laser 3. Then, the laser 3 radiates a beam c to the photodetector 4, which generates a current d. Then, the current d is supplied to the current-to-voltage converting circuit 5 in which the current d is converted into a voltage e and is amplified by the operational amplifier 6. The amplified voltage is supplied to the transistor 2 through the switching circuit 1. The transistor 2 serves to adjustably produce the reproduction driving current $I_R$. In summary, this operation can be summarized as detecting the laser beam and applying negative feedback to the detected signal for keeping a driving current constant.

In the recording mode, on the other hand, the recording power setting circuit 8 supplies a predetermined signal to the transistor 9 in which the recording driving current is adjtably produced, while the control logic circuit 11 supplies the recording signal b to the switching circuit 10. The switching circuit 10 is switched on and off in accordance with the magnitude of the signal b. The on-and-off switching results in modulating a recording driving current $I_W$ and superposing the recording signal on the driving current $I_W$. At this time, for interrupting the control operation, the reproduction driving current $I_R$ is kept at the value given immediately before executing the operation in the recording mode by a sample holding circuit (not shown).

As mentioned above, the foregoing semiconductor laser driving circuit has two or more power voltages. That is, the control logic circuit 11 is connected to the +5 power source and the reproduction power producing circuit 12 and the recording power producing circuit 13 are connected to the +12 power source. In this case, the switching of the power sources may result in bringing about a time lag between the leading and the trailing edges of the former power source and those of the latter one.

FIG. 2 is a graph showing the state of a voltage caused when the time lag appears, in particular, when the power sources are interrupted in driving the laser. In the reproduction mode, assuming that the power sources are interrupted at a time $t_0$, as shown in the curves A and B of the graph, the +5 v power source connected to the control logic circuit 11 supplies the lowest possible operating voltage for activating the logic circuit 11 at a time $t_1$ and the +12 v power source connected to the reproduction power producing circuits 12 and 13 also supplies the lowest possible operating voltage for activating the circuits 12 and 13 at a time $t_2$. At an interval of $\Delta t$ between the times $t_1$ and $t_2$, the control logic circuit 11 cannot keep its logic level stable, thereby switching on the switching circuit 10 as shown in the curve C and supplying the recording driving current $I_W$ as shown in the curve D to the laser 3. It results in bringing about a drawback that the laser output reaches such a power that it can transform the recording film formed on the disk and thus gives damage to the information recorded on the disk.

SUMMARY OF THE INVENTION

It is therefore an object of the present invention to provide an improved semiconductor laser driving circuit which is capable of inhibiting abnormal rise of a laser power often caused when the power sources are interrupted in driving the laser and preventing the information recorded on the recording film of the disk from being damaged.

To overcome the drawback, in addition to the foregoing prior art, the invention further provides a means for monitoring the power sources of the semiconductor laser driving circuit, in particular, the power source of the control logic circuit and a means for reducing driving current supplied to the semiconductor laser immediately before or when the source voltage reaches the lowest possible operating value.

Further objects and advantages of the present invention will be apparent from the following description of the preferred embodiments of the invention as illustrated in the accompanying drawings.

DESCRIPTION OF THE PREFERRED EMBODIMENTS

Figure 1:
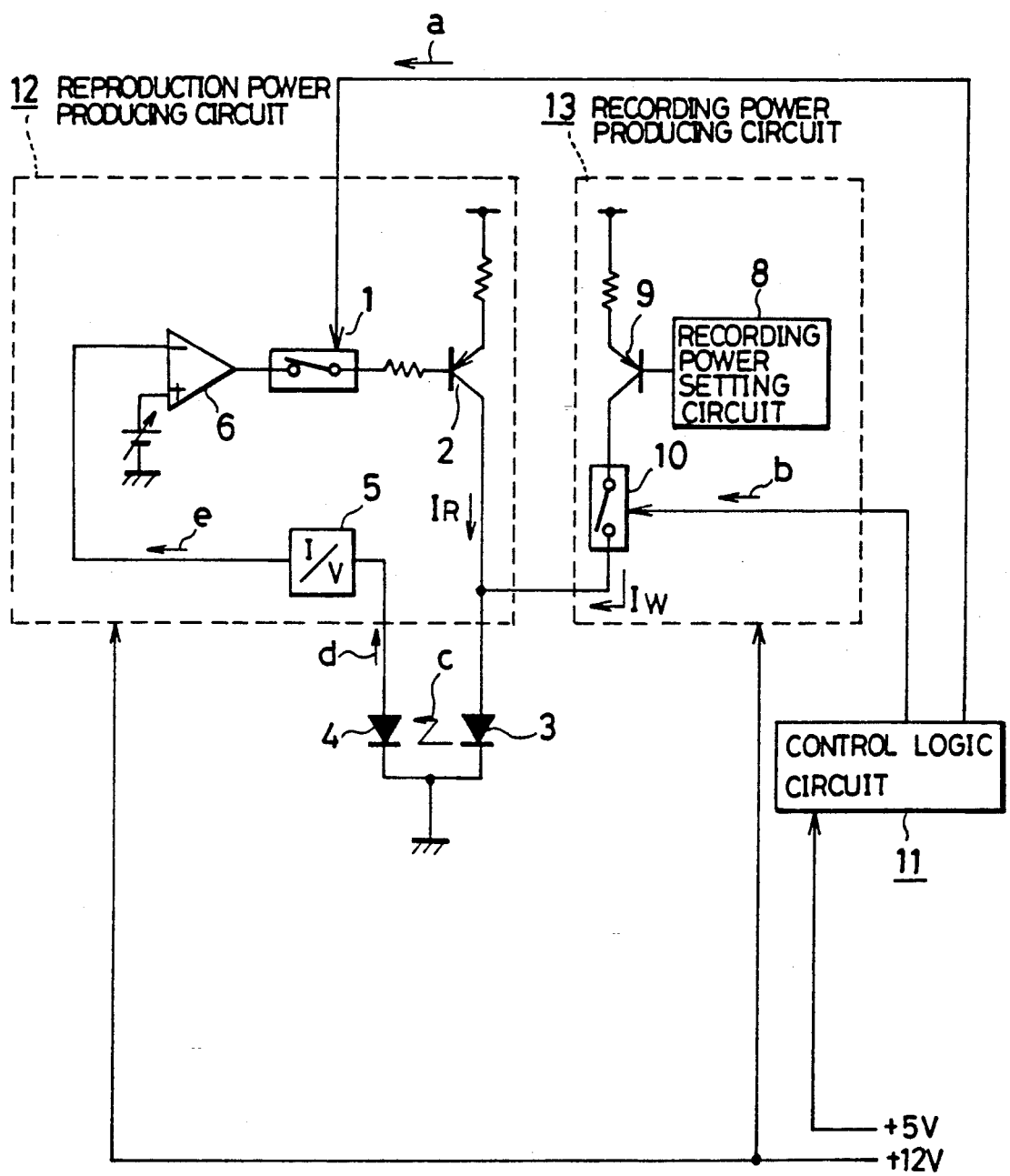
FIG. 1 is a circuit diagram showing a conventional semiconductor laser driving circuit.
Figure 2:
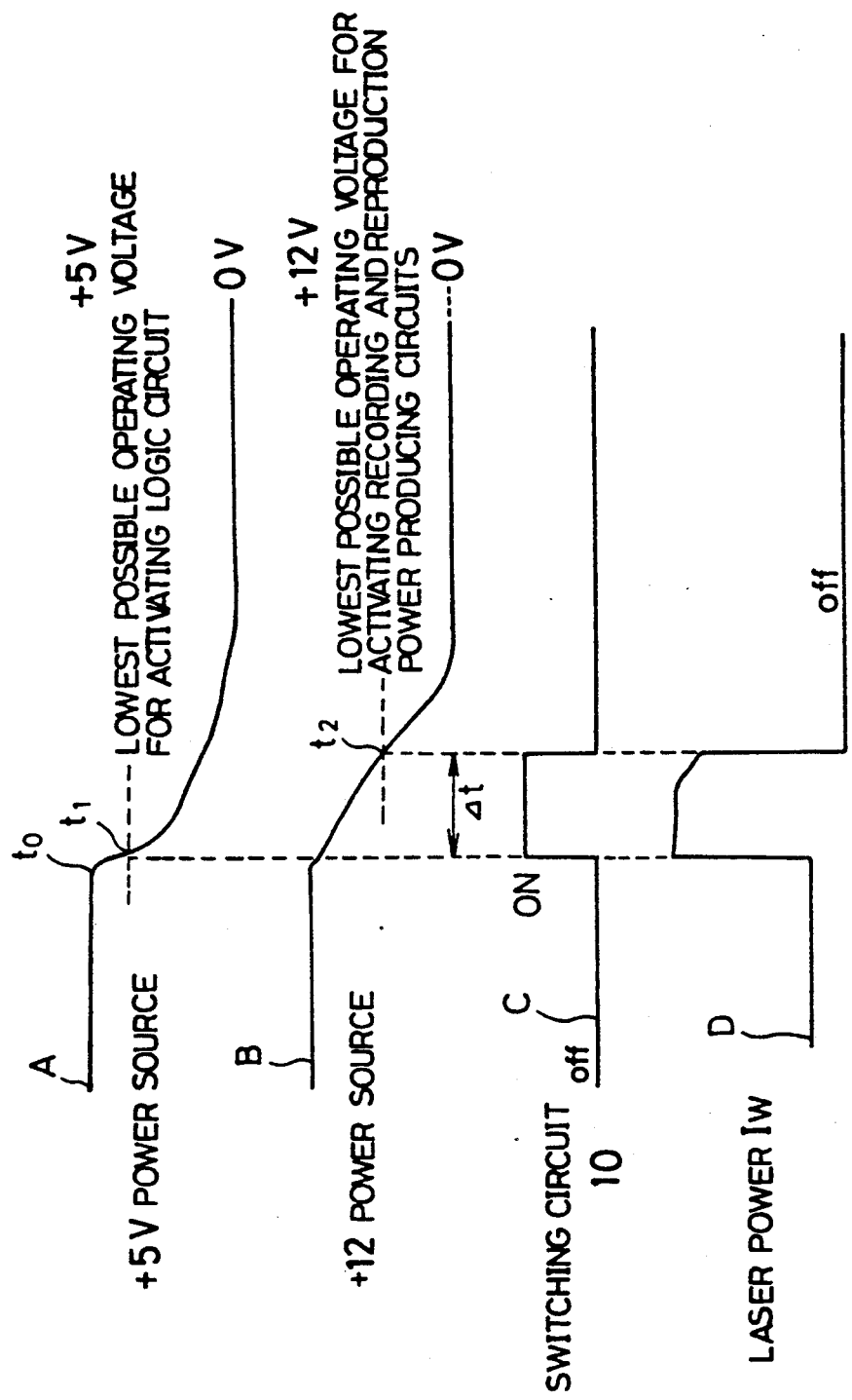
FIG. 2 is a graph showing the operation of the conventional semiconductor laser driving circuit.
Figure 3:
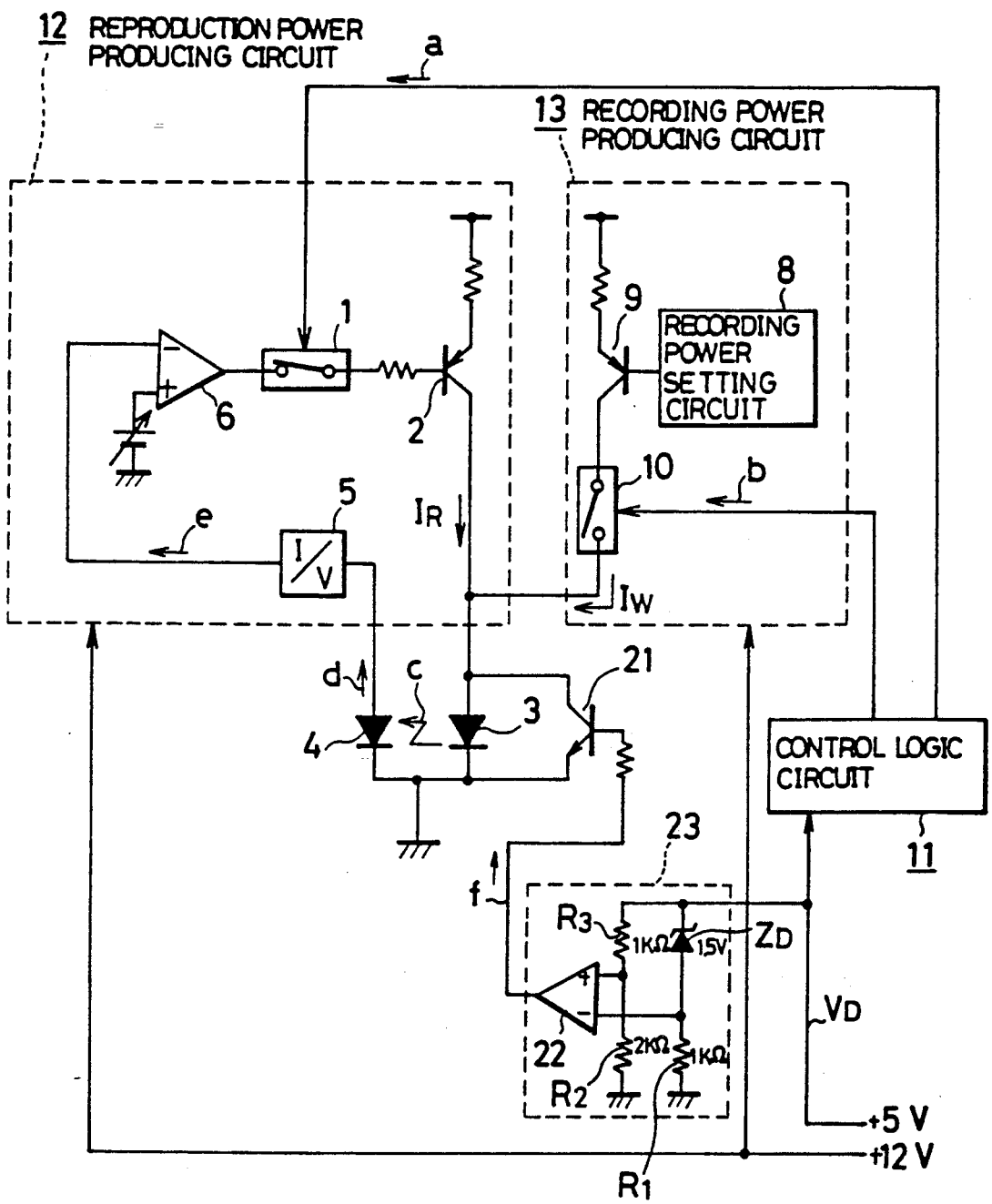
FIG. 3 is a circuit diagram showing an improved semiconductor laser driving circuit according a first embodiment of the invention.

FIG. 3 is a circuit diagram showing a first embodiment of the present invention. The embodiment is an improved semiconductor laser driving circuit designed on the foregoing prior art. The same components of this embodiment as the prior art are referenced by the same reference notes. The improved, that is, different respect of this embodiment from the conventional circuit is that a voltage monitoring circuit 23 is provided in a part of the power source circuit of the control logic circuit 11 and a bypass transistor 21 is connected in parallel to the laser 3. The voltage monitoring circuit 23 comprises a Zener diode ZD, a comparator 22 and resistors $R_1$, $R_2$, $R_3$ connected to these former two components. The cathode of the Zener diode ZD is connected to the power source of the control logic circuit 11 and a non-inverting input terminal of the comparator 22 through the resistor $R_3$. The resistors $R_3$ and $R_2$ connected in series serve as a voltage divider of the source voltage $V_D$ so that they reduce the voltage $V_D$ to a two-thirds value. Hence, the reduced voltage is applied to the non-inverting input terminal of the comparator 22. The other end of the resistor $R_2$ is connected to the ground. The anode of the Zener diode ZD is connected to both the inverting input terminal of the comparator 22 and the ground through the resistor $R_1$. It results in making the voltage applied to the inverting input terminal smaller than the source voltage $V_D$ by the Zener voltage of 1.5 V.

Figure 4:
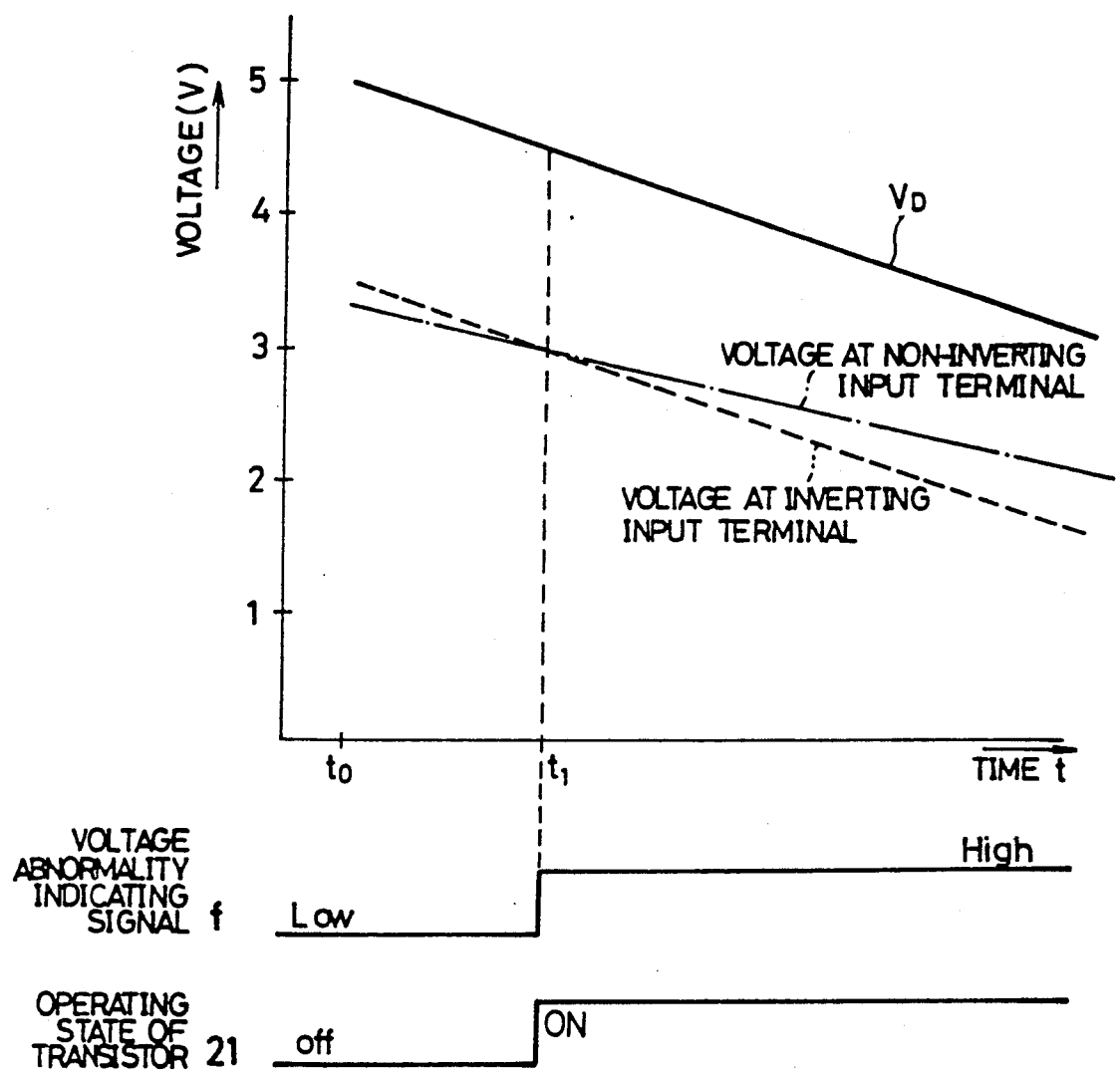
FIG. 4 is a graph showing the operation of the improved semiconductor laser driving circuit.

FIG. 4 is a graph showing the relation among a drop of the source voltage $V_D$, a drop of the voltage applied at the inverting input terminal of the comparator, a drop of the voltage applied at the non-inverting input terminal thereof, a voltage abnormality indicating signal f, and an operating state of the transistor 21 when the power source is interrupted. Assuming that the power source is interrupted at a time $t_0$, the voltages at the time point are such that the power source voltage $V_D$ is equal to 5 V, the inverting input terminal voltage is equal to $V_D - 1.5\,V = 3.5\,V$, and the non-inverting input terminal voltage is equal to $V_D \times \frac{2}{3} \approx 3.3\,V$. After the time $t_0$, these voltages gradually drop. When the source voltage $V_D$ reaches 4.5 V at a time $t_1$, the inverting input terminal voltage and the non-inverting input terminal voltage equally reach 3 V. After the time $t_1$, the relation between both voltages is reversed to be such that the non-inverting input terminal voltage is greater than the inverting input terminal voltage. This state change of the comparator 22 after the time $t_1$ brings the output of the comparator, that is, the voltage abnormality indicating signal f into a high-level one. This high-level signal results in causing the conduction of the transistor 21 and short-circuiting the laser 3. Hence, assuming that the lowest possible operating voltage of the control logic circuit 11 is 4.4 V, for example, when the source voltage $V_D$ reaches 4.5 V or less, the conventional circuit without this invention is incapable of keeping the logic level stable, thereby switching on the switching circuit 10 and allowing the recording driving current $I_W$ to be supplied to the laser 3. With the improved circuit of this invention, on the other hand, when the source voltage of the control logic circuit 11 reaches 4.5 $V_1$ or less, the voltage monitoring circuit 23 serves to monitor a voltage drop and generate the voltage abnormality indicating signal f, thereby causing the transistor 21 to be conductive. The transistor 21 is served as a bypass for the recording driving current $I_W$. Since the current $I_W$ bypasses the laser 3, the laser is unable to emit a laser beam having such high luminous intensity as being set in the recording mode. It results in preventing the recording film from being damaged by the laser 3.

Figure 5:
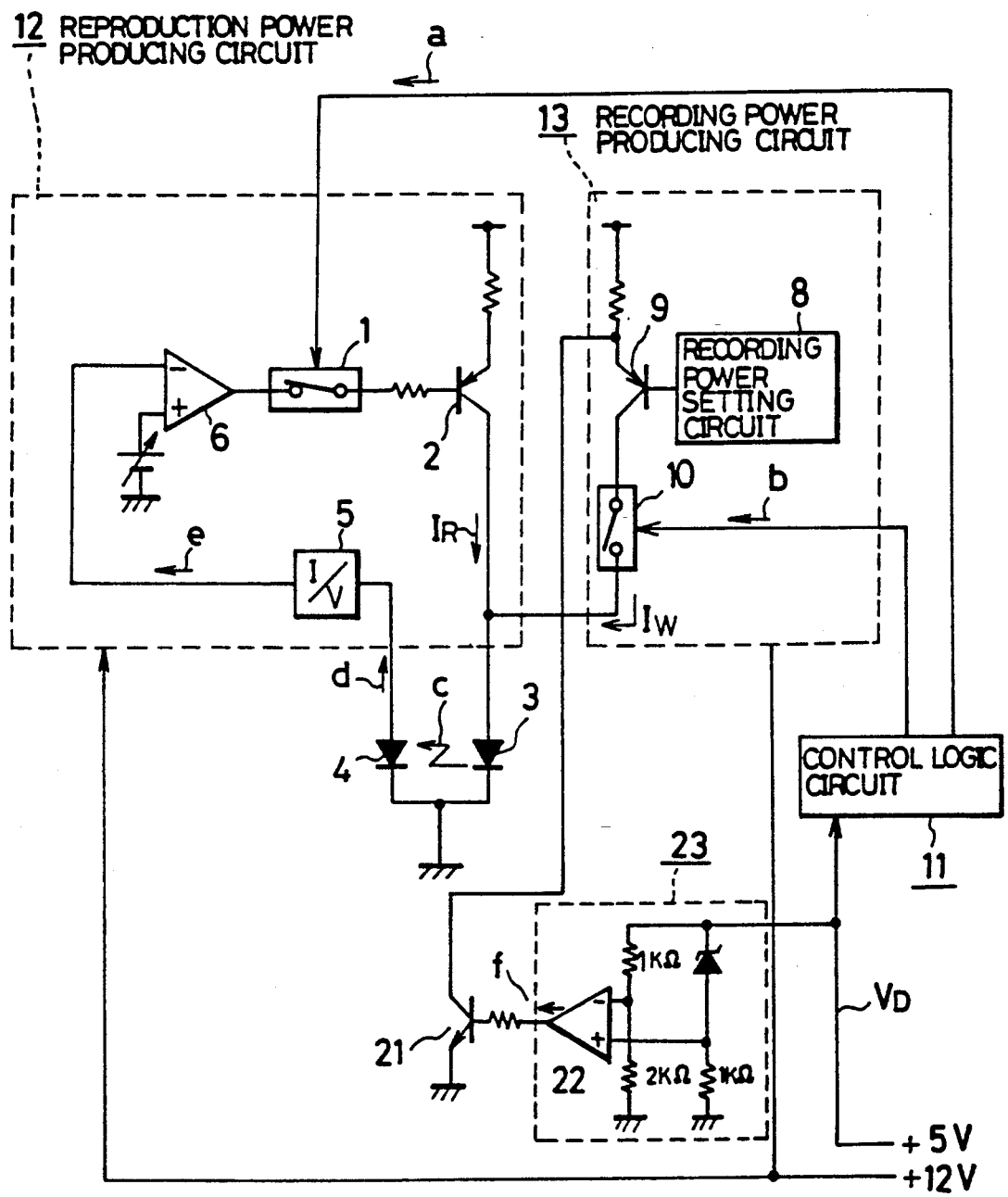
FIG. 5 is a circuit diagram showing an improved laser driving circuit according to a second embodiment of the invention.

FIG. 5 is a circuit diagram showing the second embodiment of the present invention, in which the same components of this embodiment as the first one are referenced by the same reference notes. From this figure, it will be understood that a connecting portion of a bypass transistor 21 is different from that of the first embodiment. That is, the collector of the bypass transistor 21 is connected to the emitter of the transistor 9 included in the recording power producing circuit 13. From this connection, when the source voltage $V_D$ of the control logic circuit 11 reaches a given voltage or less, therefore, the voltage monitoring circuit 23 serves to supply a high-level signal, thereby causing the transistor 21 to be conductive. Since the transistor 21 serves as a bypass of the recording power producing circuit 13, no excess current is allowed to flow through the laser 3.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor laser driving circuit comprising:
   a reproduction power producing circuit for producing a current to be supplied to a semiconductor laser for reproducing data recorded in an optical disk by applying a laser beam emitted from said laser to said disk, said reproduction power producing circuit being supplied with a first power-supply voltage;
   a recording power producing circuit for producing a current to be supplied to said laser for recording data in said disk by applying a laser beam emitted from said laser to said disk, said recording power producing circuit being supplied with said first power-supply voltage;
   a control logic circuit for controlling supply of said current to said laser, said control logic circuit being supplied with a second power-supply voltage;
   monitor means connected to said control logic circuit for monitoring a change of said second power-supply voltage; and means for reducing a current being supplied to said laser to within a predetermined value when the change monitored by said monitor means exceeds a predetermined limit.

2. A driving circuit according to claim 1, further comprising a photodetector for detecting a luminous intensity of a laser beam emitted from said laser.

3. A driving circuit according to claim 2, wherein said reproduction power producing circuit includes a transistor connected to a power source through a resistor at an emitter thereof and to said laser at a collector thereof, a current-to-voltage converting circuit for converting a current generated by said photodetector into a voltage, an operational amplifier for amplifying said voltage, and a switching circuit connected to an output terminal of said amplifier and to a base of said transistor through a resistor, an output signal of said amplifier being supplied to said base when said switching circuit is closed, closing of said switching circuit being controlled by said control logic circuit.

4. A driving circuit according to claim 1, wherein said recording power producing circuit includes a recording power setting circuit, a transistor connected to a power source at an emitter thereof through a resistor and to said recording power setting circuit at a base thereof, and a switching circuit connected to a collector of said transistor and to said laser, said collector being connected to said laser when said switching circuit is closed, closing of said switching circuit being controlled by said control logic circuit.

5. A semiconductor laser driving circuit comprising:
a reproduction power producing circuit for producing a current to be supplied to a semiconductor laser for reproducing data recorded in an optical disk by applying a laser beam emitted from said laser to said disk, said reproduction power producing circuit being supplied with a first power-supply voltage;
a recording power producing circuit for producing a current to be supplied to said laser for recording data in said disk by applying a laser beam emitted from said laser to said disk, said recording power producing circuit being supplied with said first power-supply voltage;
a control logic circuit for controlling supply of said currents to said laser, said control logic circuit being supplied with a second power-supply voltage;
monitor means connected to said control logic circuit for monitoring a change of said second power-supply voltage;
means for reducing a current being supplied to said laser to within a predetermined value when the change monitored by said monitor means exceeds a predetermined limit; and
wherein said monitor means includes a Zener diode, a comparator, and a first to third resistors, said Zener diode being connected at a cathode thereof to both said second power source connected to said control logic circuit and a non-inverting input terminal of said comparator through the first resistor, said Zener diode being connected at an anode thereof to an inverting input terminal of said comparator and a ground through the second resistor, and said non-inverting input terminal being grounded through the third resistor.

6. A driving circuit according to claim 5, wherein said reducing means comprises a bypass transistor whose base is connected to an output terminal of said comparator through a resistor and whose emitter is connected to a ground.

7. A driving circuit according to claim 6, wherein a collector of said bypass transistor is connected to an input terminal of said laser.

8. A driving circuit according to claim 6,
wherein said recording power producing circuit includes a recording power setting circuit, a transistor connected to a power source at an emitter thereof through a resistor and to said recording power setting circuit at a base thereof, and a switching circuit connected to a collector of said transistor and to said laser, said collector being connected to said laser when said switching circuit is closed, closing of said switching circuit being controlled by said control logic circuit;
and a collector of said bypass transistor is connected to the emitter of said transmitter included in said recording power producing circuit.

* * * * *